United States Patent
Wong

[19]

[11] Patent Number: 5,946,204
[45] Date of Patent: Aug. 31, 1999

[54] VOLTAGE BOOSTER WITH REDUCED VPP CURRENT AND SELF-TIMED CONTROL LOOP WITHOUT PULSE GENERATOR

[75] Inventor: Anthony Yap Wong, Cupertino, Calif.

[73] Assignee: Pericom Semiconductor Corp., San Jose, Calif.

[21] Appl. No.: 09/197,322

[22] Filed: Nov. 19, 1998

Related U.S. Application Data

[63] Continuation-in-part of application No. 08/990,894, Dec. 15, 1997, Pat. No. 5,847,946.

[51] Int. Cl.[6] .............................. H02M 3/18; H02K 5/13
[52] U.S. Cl. .............................................. 363/60; 327/108
[58] Field of Search ........................ 363/59, 60; 327/108, 327/157; 365/189.11, 230.06

[56] References Cited

U.S. PATENT DOCUMENTS

| | | | |
|---|---|---|---|
| 4,639,622 | 1/1987 | Goodwin et al. | 327/589 |
| 4,704,706 | 11/1987 | Nakano et al. | 365/203 |
| 5,134,317 | 7/1992 | Ohta | 326/98 |
| 5,140,182 | 8/1992 | Ichimura | 327/536 |
| 5,258,956 | 11/1993 | Ahn et al. | 365/204 |
| 5,436,821 | 7/1995 | Inoue | 363/60 |
| 5,642,313 | 6/1997 | Ferris | 365/185.25 |
| 5,663,665 | 9/1997 | Wang et al. | 327/3 |
| 5,670,869 | 9/1997 | Weisenbach | 323/313 |
| 5,768,115 | 6/1998 | Pascucci et al. | 363/59 |
| 5,847,946 | 12/1998 | Wong | 363/60 |

Primary Examiner—Adolf Deneke Berhane
Attorney, Agent, or Firm—Stuart T. Auvinen

[57] ABSTRACT

An n-channel bus switch has a transistor gate boosted above the power supply (Vcc) to increase current drive and reduce the channel resistance of the bus switch. No pulse generator is needed. The gate terminal is connected to a boosted node. When the bus switch is turned on, a pullup transistor drives the boosted node from ground to Vcc. The pulse generator is eliminated by using a Schmidt-trigger to sense the voltage of the boosted node. Once the Schmidt-trigger senses that the voltage of the boosted node is near Vcc, the pull-up is turned off. A delay line first drives the gate of the pullup transistor to a threshold below Vcc using an n-channel pullup, and then drives the gate to Vpp using a p-channel pullup. A delay line then drives the back-side of a capacitor from ground to Vcc. This voltage swing is coupled through the capacitor to the boosted node, driving the boosted node about 1.3 volts above Vcc. A small keeper transistor supplies a small current to the boosted node to counteract any leakage. Vpp current drain is reduced by using multiple stages to turn the pullup off.

20 Claims, 6 Drawing Sheets

VOLTAGE BOOSTER WITH REDUCED VPP CURRENT AND SELF-TIMED CONTROL LOOP WITHOUT PULSE GENERATOR

RELATED APPLICATION

This application is a continuation-in-part of the application for "Improved Voltage Booster With Reduced Vpp Current and Self-Timed Control Loop Without Pulse Generator", U.S. Ser. No. 08/990,894, filed Dec. 15, 1997, now U.S. Pat. No. 5,847,946, hereby incorporated by reference.

FIELD OF THE INVENTION

This invention relates to CMOS integrated circuits, and more particularly to voltage booster circuits.

BACKGROUND OF THE INVENTION

Bus switches manufactured with semiconductor technology are used for high-speed network routing and switching applications. Complementary metal-oxide-semiconductor (CMOS) transistors may be used for bus switches, with a p-channel and an n-channel transistor in parallel as a transmission gate connecting or isolating two networks attached to the sources and drains of the transistors.

However, some systems use both 5-volt and 3-volt signals. These mixed systems can output a 5-volt signal to a 3-volt bus switch. The 3-volt bus switch could potentially latch up if a p-channel transistor was used in the switch. Using only n-channel transistors for the bus switch is therefore desirable for 3 v/5 v systems.

One solution is to boost the gate voltage to an n-channel transistor that acts as a bus switch. The gate voltage can be boosted above the 3-volt power supply by a voltage-booster circuit. For example, the gate voltage can be boosted to 4.3 volts using a capacitive pump. See for example, U.S. Pat. No. 4,639,622 by Goodwin et al., assigned to IBM; U.S. Pat. No. 4,063,117 by Lagesen et al., assigned to National Semiconductor Corp.; and U.S. Pat. No. 4,704,706 by Nakano et al., assigned to Fujitsu Ltd.

Voltage Booster in Parent Application—FIGS. 1,2,3

The parent application disclosed a voltage booster for boosting the gate voltage of an n-channel bus-switch transistor. FIG. 1 is a simplified diagram of a voltage booster circuit. Bus-switch n-channel transistor 26 selectively connects two network lines through the channel of transistor 26. The gate of transistor 26 is boosted in voltage to a voltage above Vcc when transistor 26 is turned on. The gate node of transistor 26 is thus the boosted node.

The voltage booster circuit is inverting. When V_IN is high, pull-down 16 pulls the boosted node down to ground, turning off transistor 26. To enable the bus-switch transistor 26, V_IN is pulled low. Pull-down 16 is disabled. Pulse generator 12 pulses the boosted node to Vcc using pulsed pull-up 14. Bus-switch transistor 26 is turned on, but only weakly conducts since its gate is at Vcc rather than the boosted voltage.

The boosted node is input to delay line 20. When pulsed pull-up 14 drives the boosted node to Vcc, delay line 20 is activated. Delay line 20 then outputs a high voltage that activates keeper 18, a relatively small transistor that maintains a high voltage on the boosted node.

Delay line 20 also drives a power-supply voltage (Vcc) onto the back-side of capacitor 24, voltage V_BACK_CAP. The back-side of capacitor 24 was at ground, but is quickly driven high to Vcc by delay line 20. The 3-volt (ground to Vcc) swing on the back-side of capacitor 24 is coupled to the boosted node already at Vcc, raising its voltage above Vcc.

Delay line 20 and keeper 18 are connected to a pumped power supply voltage (Vpp) rather than Vcc. This prevents current flow from the boosted node to Vcc when the boosted node is driven above Vcc. A charge pump generates Vpp, about 4.3 volts, a transistor threshold voltage above Vcc.

Sequence of Events During Boosting—FIG. 2

FIG. 2 is a diagram of the sequence of events in the parent application's voltage booster. The input signal disables the pull-down of the boosted node, step 31. A pulse is generated from the falling input, step 30. This pulse is used to boost the boosted node to the power supply Vcc, step 32.

After a delay through a charge-pumped delay line, step 34, the delay line drives the back-side of the capacitor from ground to Vcc, step 38. This voltage swing is capacitivly coupled through the capacitor to the boosted node, step 40. The voltage on the boosted node is boosted up to about Vpp. A small keeper pull-up is enabled, step 36.

Detailed Circuit Using Pulse Generator—FIG. 3

FIG. 3 is a schematic diagram of the parent application's voltage booster circuit using a pulse generator. When V_IN is high, the boosted node (V_BOOST) is grounded so bus-switch transistor 26 is turned off. The back-side node (V_BACK_CAP) is also grounded, so that both sides of capacitor 24 are grounded. Transistors 55, 56, and 58 are off, disabling all pull-up current paths. The boosted node is pulled down to ground by pull-down n-channel transistor 48 when V_IN is high.

Inverter 70 and NAND gate 72 form a pulse generator, with the pulse width determined by the delay through inverter 70. P-channel transistors 52, 55 are a pulsed pull-up used to initially pulse the boosted node to Vcc.

Charge pump 60 drives the sources of p-channel pull-up transistors within inverters 80, 82, 84 in the delay line to Vpp. The delay line has its input connected to the boosted node. NAND gate 64 and inverters 66, 76 drive the back-side of capacitor 24 from ground to Vcc after the delay through the delay line. Inverters 76, 66, and NAND gate 64 are not connected to Vpp to reduce current drawn from Vpp.

P-channel transistors 56, 58 act as small keeper transistors to compensate for any leakage currents in the boosted node. The source and substrate terminals of p-channel keeper transistor 56 are connected to Vpp from charge pump 60.

Operation Relies on Pulse Generator

The operation of the parent application's voltage booster is controlled by the pulse generator of NAND gate 72 and inverter 70. The low-going pulse is terminated after the delay through inverter 70. The low-going pulse from NAND gate 72 must be long enough for p-channel pulse transistor 55 to pull the boosted node up to Vcc (3 volts).

A self-timed control loop of inverters 80, 82 turn off pulse transistor 52. This ends the initial charging of V_BOOST to Vcc. The boosted node is then isolated from Vcc by pulse transistor 52 being turned off by the delay line.

Process, Vcc, and Temperature Sensitivity

Process, Vcc, and temperature variations alter the width of the pulse generated by the pulse generator of NAND gate 72 and inverter 70. Should the pulse become too narrow, node V_BOOST might not be charged all the way to Vcc. A lower than expected gate voltage on the bus-switch transistor could then increase the bus switch's ON resistance, unexpectedly slowing the network.

Inverter 80 does not actually sense when V_BOOST has not reached Vcc. Instead, inverter 80 switches once its input threshold is reached. Input thresholds are typically at Vpp/2. If the pulse width is too narrow, V_BOOST might not reach Vpp/2. The inverter may fail to switch.

It is thus desired to eliminate the pulse generator from the voltage booster circuit. It is further desired to alter the feedback path to more closely sense Vcc rather than an intermediate logic threshold such as Vcc/2.

Furthermore, V_BOOST is driven to Vcc by transistors 52, 56 in a series connection. The series connection of transistors 52, 56 requires that larger-size transistors be used. It is desired to use a smaller, single transistor for pulling V_BOOST to Vcc.

The large size of transistor 52 requires that inverter 82 be relatively large. Since inverter 82 is connected to Vpp rather than Vcc, it draws current from the Vpp charge pump. The large size of inverter 82 increased the current drain from the Vpp charge pump, requiring a larger capacity charge pump. This is also undesirable.

While the parent application's voltage-booster circuit is effective, a more efficient and precise voltage booster circuit is desirable. A voltage booster for an n-channel bus switch is desired that draws less current from a Vpp charge pump. It is desired to eliminate the pulse generator to reduce sensitivity to process, power supply, and temperature variations. It is further desired to eliminate the series transistor connection that initially pulls the boosted node to Vcc. Better sensing of Vcc on the boosted node is desired.

SUMMARY OF THE INVENTION

A voltage booster has a buffer for buffering an input to generate a buffered input. A charge pump generates a pumped voltage above a power-supply voltage. A boosted node is driven from ground to a boosted voltage above the power-supply voltage.

A pull-down n-channel transistor is coupled to drive the boosted node to ground in response to the buffered input. A pull-up p-channel transistor has a gate controlled by the buffered input. It couples the boosted node to a keeper node. A keeper p-channel transistor is coupled to supply a keeper current to the keeper node from the charge pump. The keeper p-channel transistor has a gate.

A control node is initially driven low in response to the buffered input. A first p-channel transistor has a drain coupled to the boosted node and a source coupled to the power-supply voltage. It conducts current from a power supply to the boosted node in response to the control node applied to a gate of the first p-channel transistor. A second p-channel transistor has a drain coupled to the control node and a source coupled to the pumped voltage from the charge pump. It conducts current from the pumped voltage to the control node. The second p-channel transistor has a gate controlled by a delayed node.

A delay line of inverters has a first inverter with an input connected to the boosted node. It delays a rising transition of the boosted node to drive the delayed node to the second p-channel transistor. A capacitor is driven by the delay line and coupled to the boosted node. It couples a voltage swing output from the delay line to the boosted node.

The delay line from the boosted node enables the second p-channel transistor and disables the first p-channel transistor after the boosted node has been charged to the power-supply voltage. The capacitor is pumped after the delay line delays the rising transition of the boosted node. Thus the voltage booster is self-timed by the boosted node being fed back to the delay line.

In further aspects of the invention the first inverter in the delay line comprises a Schmidt-trigger inverter. The Schmidt-trigger inverter has a high input threshold. An output of the Schmidt-trigger inverter is driven low once the boosted node nears the power-supply voltage.

DETAILED DESCRIPTION

The present invention relates to an improvement in voltage booster circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that his voltage booster circuit may be improved. In particular, the inventor has realized that the pulse generator is sensitive to process, power-supply, and temperature variations. Eliminating the pulse generator significantly reduces the sensitivity of the circuit and improves its robustness.

The inventor has also realized that the feedback inverter from the boosted node may not turn on because of a very narrow pulse width. The input threshold may be raised closer to Vcc by replacing the inverter with a Schmidt-trigger inverter. With the Schmidt-trigger inverter, the feedback control loop senses a voltage closer to Vcc and operates more closely to the ideal model.

The inventor has further realized that a single, non-stacked transistor is better suited to initially pull the boosted node to Vcc than a series of two transistors. Thus the pulse-off transistor 52 is separated from pulse-on transistor 55. Eliminating the pulse turn-off transistor 52 eliminates the large inverter driving its gate, eliminating the additional current drain on the Vpp charge pump.

The inventor uses a single-stage circuit to initially boost the boosted node to Vcc rather than multiple stages. This allows a single transistor to drive the boosted node to Vcc, rather than a series-connected transistor. Smaller transistor and inverter sizes can be used in the preceding stages.

Figure 1:
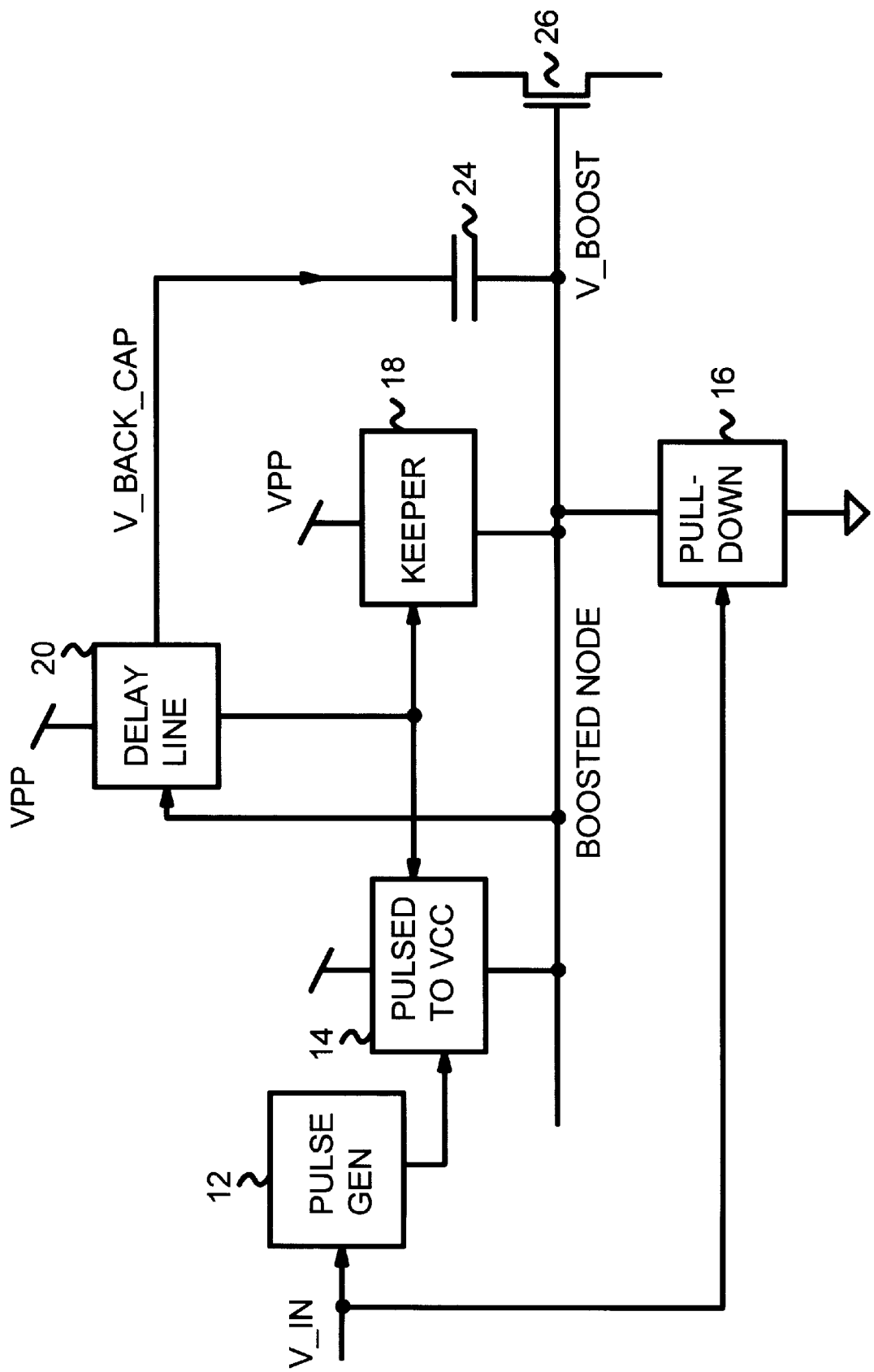
FIG. 1 is a simplified diagram of a voltage booster circuit.
Figure 2:
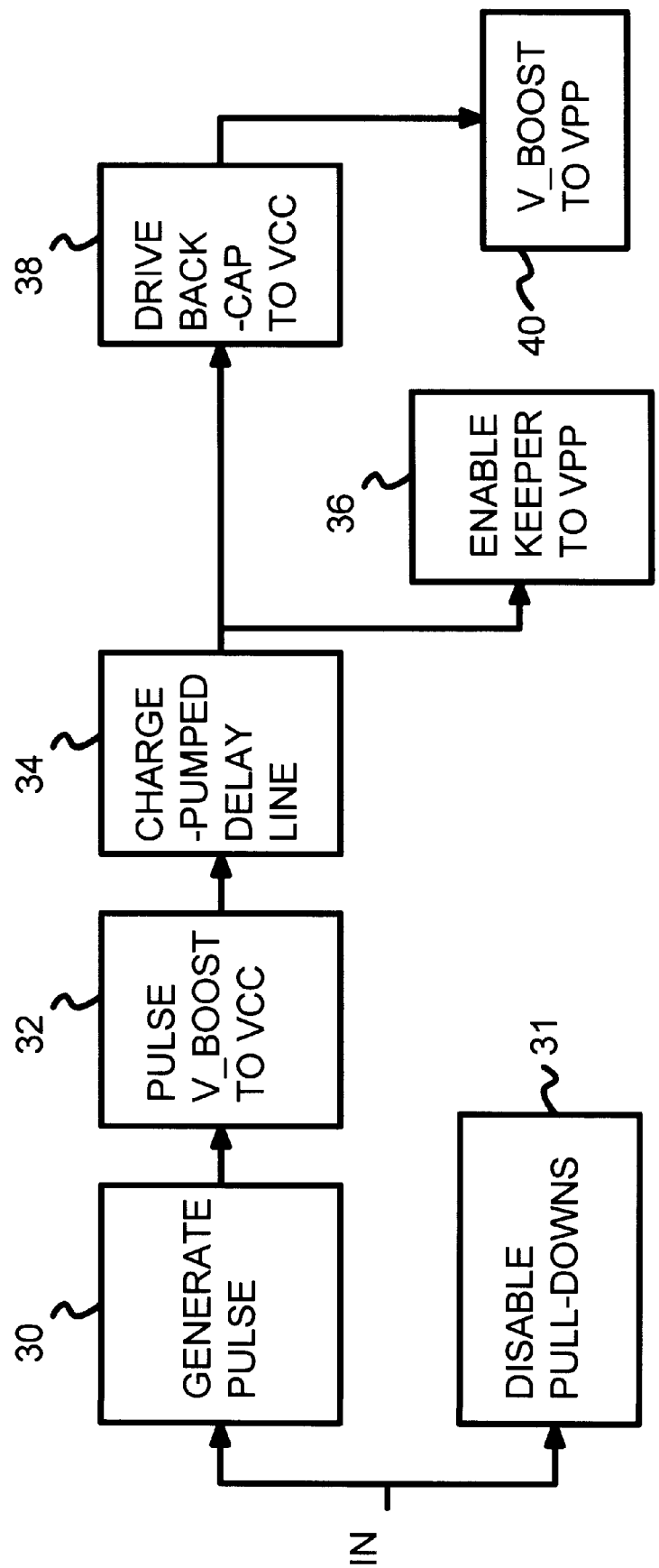
FIG. 2 is a diagram of the sequence of events in the parent application's voltage booster.
Figure 3:
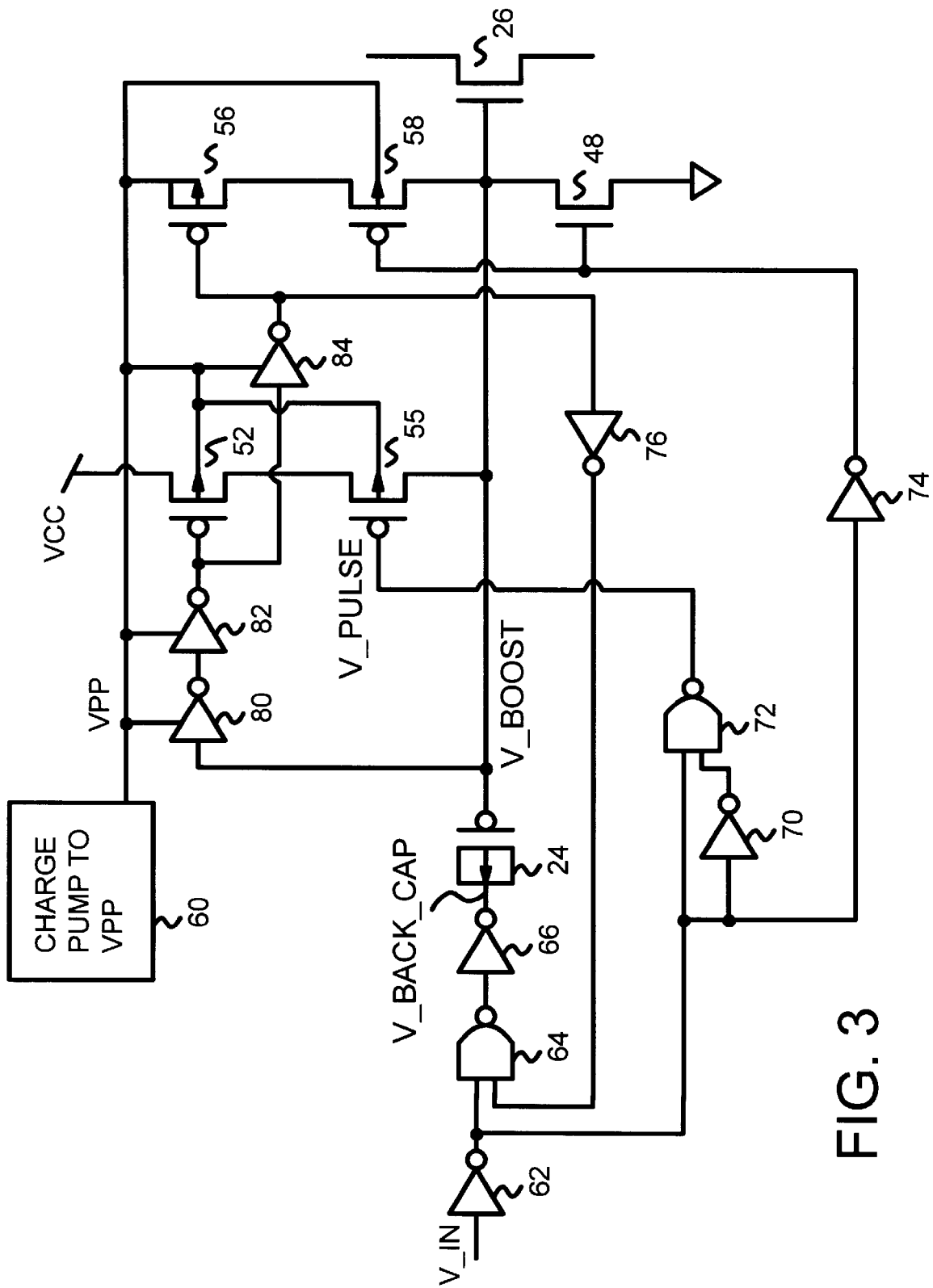
FIG. 3 is a schematic diagram of the parent application's voltage booster circuit using a pulse generator.
Figure 4:
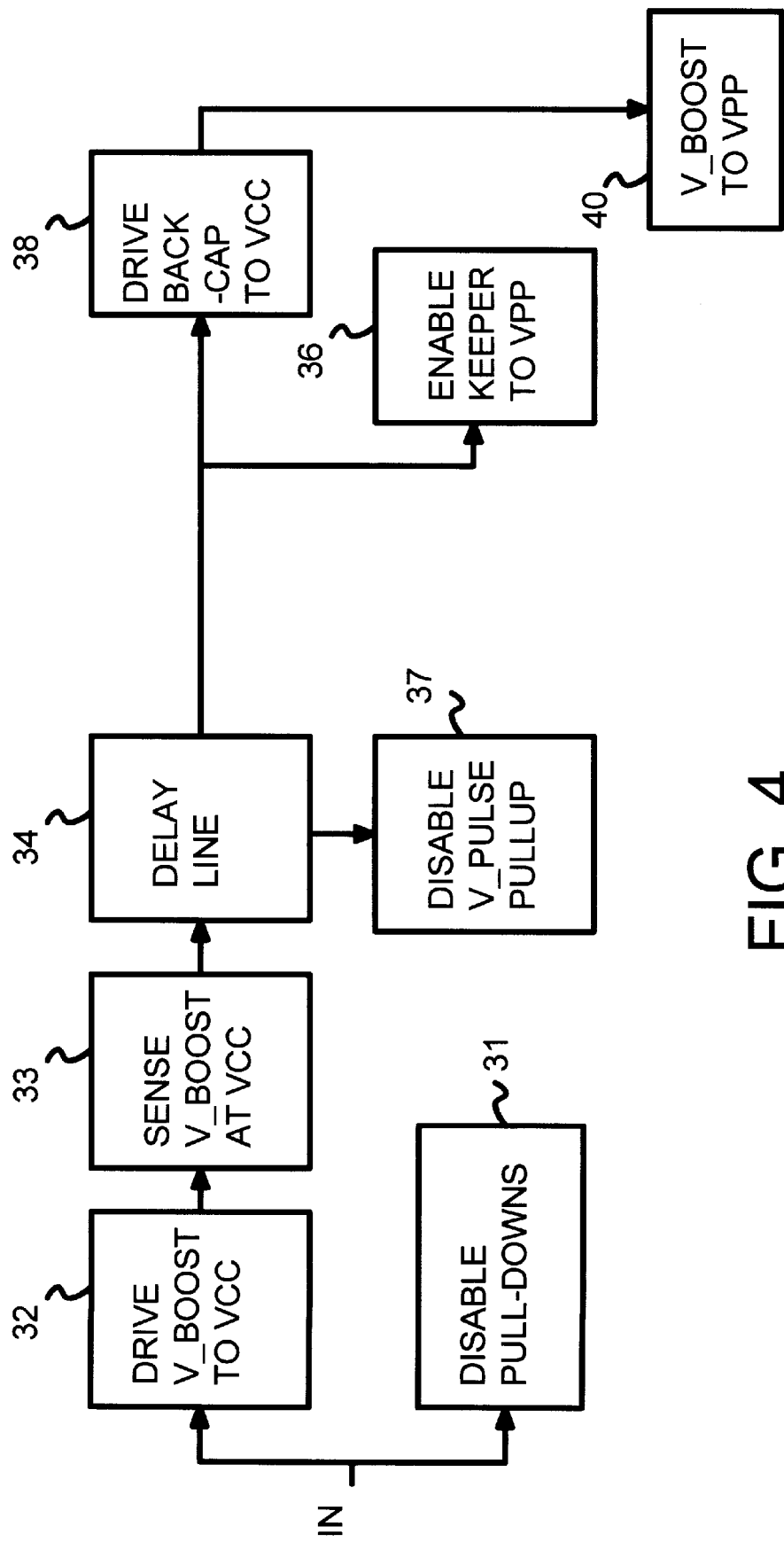
FIG. 4 is a diagram of an improved sequence of events when boosting the gate voltage above Vcc.

New Sequence of Events During Boosting—FIG. 4

FIG. 4 is a diagram of an improved sequence of events when boosting the gate voltage above Vcc. The input signal disables the pull-down of the boosted node, step 31. Rather than generate a pulse, the boosted node (V_BOOST) is driven to Vcc, step 32.

A Schmidt-trigger inverter senses when the boosted node reaches Vcc, or a voltage slightly below Vcc, step 33. After a delay through a delay line, step 34, the gate of the transistor pulling V_PULSE up to Vcc is then disabled, step 37. The delay line also drives the back-side of the capacitor from ground to Vcc, step 38. This voltage swing is capacitivly coupled through the capacitor to the boosted node, step 40. The voltage on the boosted node is boosted up to about Vpp, depending on the capacitive coupling ratio.

A small keeper pull-up is enabled, step 36. This keeper device is not large enough to pull the boosted node to the charge-pump voltage Vpp, but is large enough to compensate for small leakage currents from the boosted node.

This sequence of events first drives the boosted gate node to Vcc, and then after a delay the boosted node is driven to Vpp by capacitive coupling. Enabling and disabling of keeper and pull-down devices are precisely coordinated to maximize the voltage boost.

Figure 5:
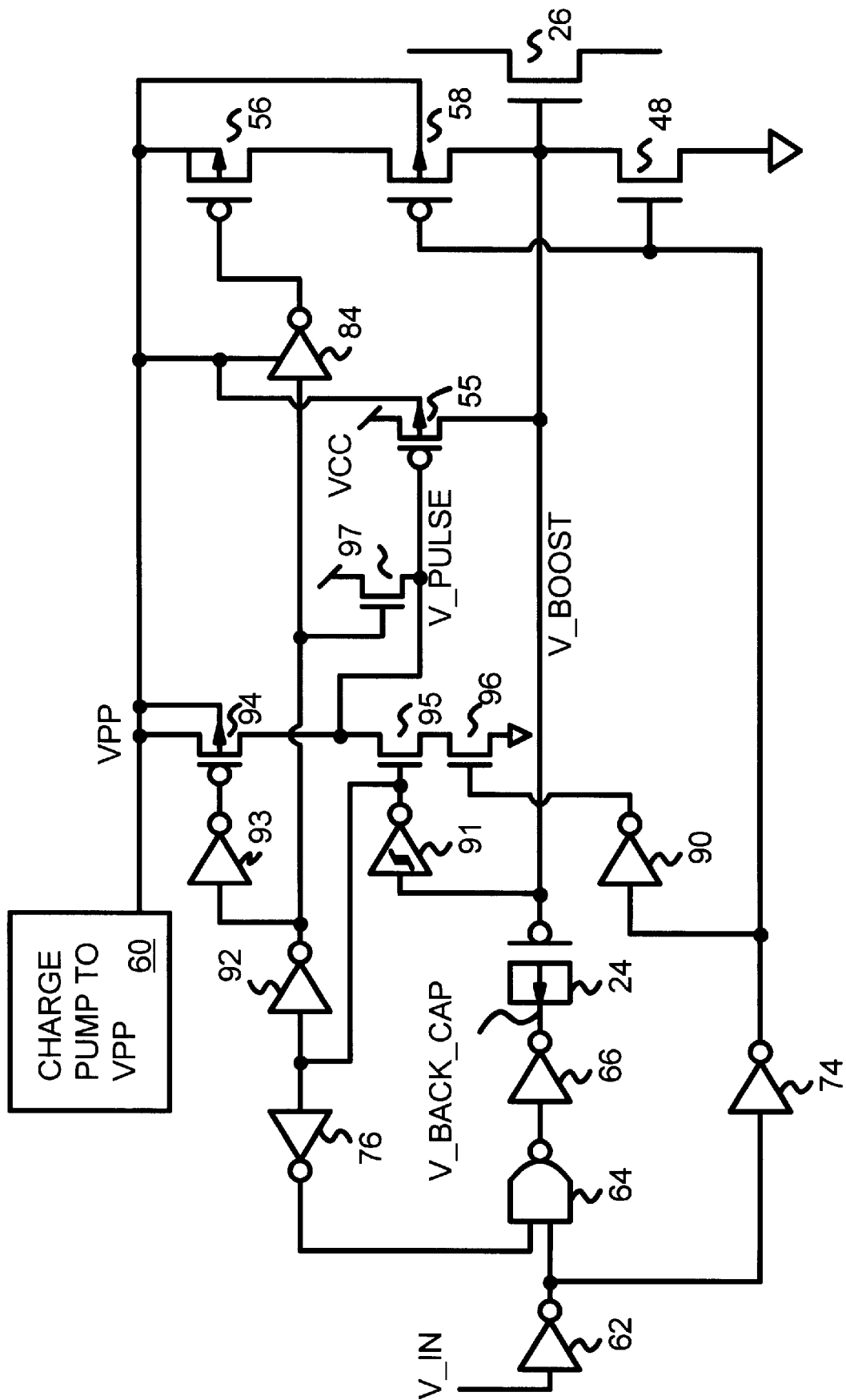
FIG. 5 is a schematic diagram of an improved voltage booster circuit without a pulse generator.

Detailed Circuit Without Pulse Generator—FIG. 5

FIG. 5 is a schematic diagram of an improved voltage booster circuit without a pulse generator. When V_IN is high, the boosted node (V_BOOST) is grounded so bus-switch transistor 26 is turned off. The back-side node (V_BACK_CAP) is also grounded, so that both sides of capacitor 24 are grounded. Transistors 55, 56, and 58 are off, disabling all pull-up current paths. The boosted node is pulled down to ground by pull-down n-channel transistor 48 when V_IN is high.

P-channel transistor 55 is a non-series-connected pull-up used to initially drive the boosted node to Vcc. The gate of p-channel transistor 55, V_PULSE, is initially high but is driven low through n-channel transistors 95, 96 when the input V_IN goes low. Inverter 90 drives high the gate of n-channel transistor 96 while n-channel transistor 95 is already on since it is driven high by Schmidt-trigger inverter 91 which senses the initial low voltage on V_BOOST.

Once p-channel transistor 55 drives V_BOOST to near Vcc, Schmidt-trigger inverter 91 switches its output low, disabling n-channel transistor 95. Inverter 92 turns on n-channel pullup transistor 97, which pulls V_PULSE up to Vcc-Vtn. Then inverter 93 enables p-channel transistor 94 to drive V_PULSE all the way up to Vpp, completely shutting off p-channel transistor 55.

Charge pump 60 drives the sources to Vpp of a p-channel pull-up transistor within inverter 84 in the delay line. The delay line has its input connected to the boosted node by Schmidt-trigger inverter 91, and includes inverters 92, 93 driving p-channel transistor 94 and inverter 76 that drives the back-side of capacitor 24 from ground to Vcc after the delay through the delay line. Inverters 76, 92, 93 and Schmidt-trigger inverter 91 are not connected to Vpp to reduce current drawn from Vpp. Thus only part of the delay line, inverter 84, is charge-pumped.

P-channel transistors 56, 58 act as small keeper transistors to compensate for any leakage currents in the boosted node. The source and N-well terminals of p-channel keeper transistor 56 are connected to Vpp from charge pump 60. The N-well substrates of transistors 55, 58 are connected to Vpp so that the p+-to-substrate diodes at the sources of these transistors do not become forward biased and conduct current from the boosted node.

P-channel transistors turn on when their gates are at least a p-channel threshold below their sources. If Vpp is more than a threshold above Vcc, and is applied to the source of transistors 56, then the transistor could turn on when the gate is driven to Vcc when it should be off. Sub-threshold currents can also be a problem even if the gate-to-source voltage is somewhat less than a threshold. To avoid these problems, the gate of transistor 56 is driven high to Vpp rather than to Vcc, so that the gate-to-source voltage is zero when the transistor is intended to be off. Inverter 84 in the delay line are thus connected to Vpp rather than Vcc so that it drives the gates of transistor 56 high to Vpp. The substrates of transistors 94, 55 are also connected to Vpp.

Capacitor 24 is constructed from a p-channel transistor with its source, drain, and substrate (bulk) terminals connected together as the back-side node of capacitor 24, while the transistor's gate is the front-side node, the boosted node. Using the gate of capacitor 24 for the boosted node reduces leakage and parasitic capacitances. A p-channel transistor is used to construct capacitor 24 so that it can have its own N-well; n-channel transistors share a common p-type substrate.

Operation

Initially, when V_IN is high and the bus switch is disabled, isolating the source and drain of bus-switch transistor 26, transistors 55, 56, 58, 96, and 97 are off while transistors 48, 94 and 95 are on. V_BOOST is at ground while V_PULSE is at Vpp.

When V_IN is asserted low to enable bus-switch transistor 26, a sequence of events is initiated as shown in FIG. 4. The low transition of V_IN is transmitted through inverters 62, 74 to disable pull-down n-channel transistor 48 and enable p-channel transistor 58. P-channel transistors 56, 58 are in series, but current does not yet flow since keeper p-channel transistor 56 is still off. The back-side of capacitor 24 remains at ground even when the bottom input to NAND gate 64 transitions high, because inverter 76 still drives a low to the upper input to NAND gate 64.

Inverter 90 drives high the gate of n-channel transistor 96. Since n-channel transistor 95 is still on, since V_BOOST is low, V_PULSE is discharged to ground through n-channel transistors 95, 96. Once V_PULSE is discharged, the gate of p-channel transistor 55 is low and transistor 55 turns on. The boosted node is driven high from ground to Vcc through p-channel transistor 55. P-channel pulse transistor 55 continues to pull the boosted node up to Vcc (3 volts).

Once the boosted node is pulled from ground up to Vcc by transistor 55, the delay line is activated. Schmidt-trigger inverter 91 has its input connected directly to the boosted node. Schmidt-trigger inverter 91 has a high logic threshold and switches as V_BOOST nears Vcc. Once Schmidt-trigger inverter 91 switches, a low is driven to the gate of n-channel transistor 95, isolating V_PULSE.

Inverter 92 then drives a high to the gate of n-channel pullup transistor 97. V_PULSE is pulled up to Vcc-Vtn, one transistor threshold below Vcc. After a delay through inverter 93, the gate of p-channel transistor 94 is driven low, and p-channel transistor 94 drives V_PULSE up beyond Vcc-Vtn to Vpp. Since Vpp is greater than Vcc, p-channel transistor 55 is shut off.

Inverter 84 in the delay line then drives a low voltage to keeper p-channel transistor 56, which then supplies a very small current from Vpp to the boosted node through transistor 58, which is also on. The size of keeper p-channel transistors 56, 58 are small so that little current is drawn from charge pump 60. These transistors are not large enough to actively drive the boosted node to Vpp, which requires several milliamps of current. Instead, only a few microamps of current are supplied, reducing the drain on charge pump 60.

Inverter 76 then drives a high to the upper input of NAND gate 64, and inverter 66 drives the back-side of capacitor high, from ground to Vcc. Inverter 66 can be made large and fast to quickly drive the back-side of capacitor 24. Part of this 3-volt swing is coupled to the front-side of capacitor 24, resulting in a boost in the voltage of the boosted node. The voltage is boosted from Vcc (3 volts) to about 4.3 volts (about the same as Vpp). This boosted voltage is applied to the gate of bus-switch transistor 26, increasing the gate-to-source voltage and thus increasing its current drive and reducing its channel resistance. A faster bus switch is thus achieved.

The voltage boost coupled through capacitor 24 is determined by the coupling ratio, a ratio of the capacitance of capacitor 24 to the total capacitance of the boosted node. The gate capacitance of transistor 26 is significant, while the input capacitance to the delay line and the drain capacitances of pull-down transistor 48, pull-up transistor 55, and keeper 58 are smaller. A coupling ratio of 0.3 to 0.5 can be achieved by making capacitor 24 large and minimizing other capacitances on the boosted node. Such a coupling ratio coupes 1 to 1.5 volts of the 3-volt swing into the boosted node. Thus the voltage V_BOOST on the gate of transistor 26 is boosted to about 4.0 to 4.5 volts.

Figure 6:
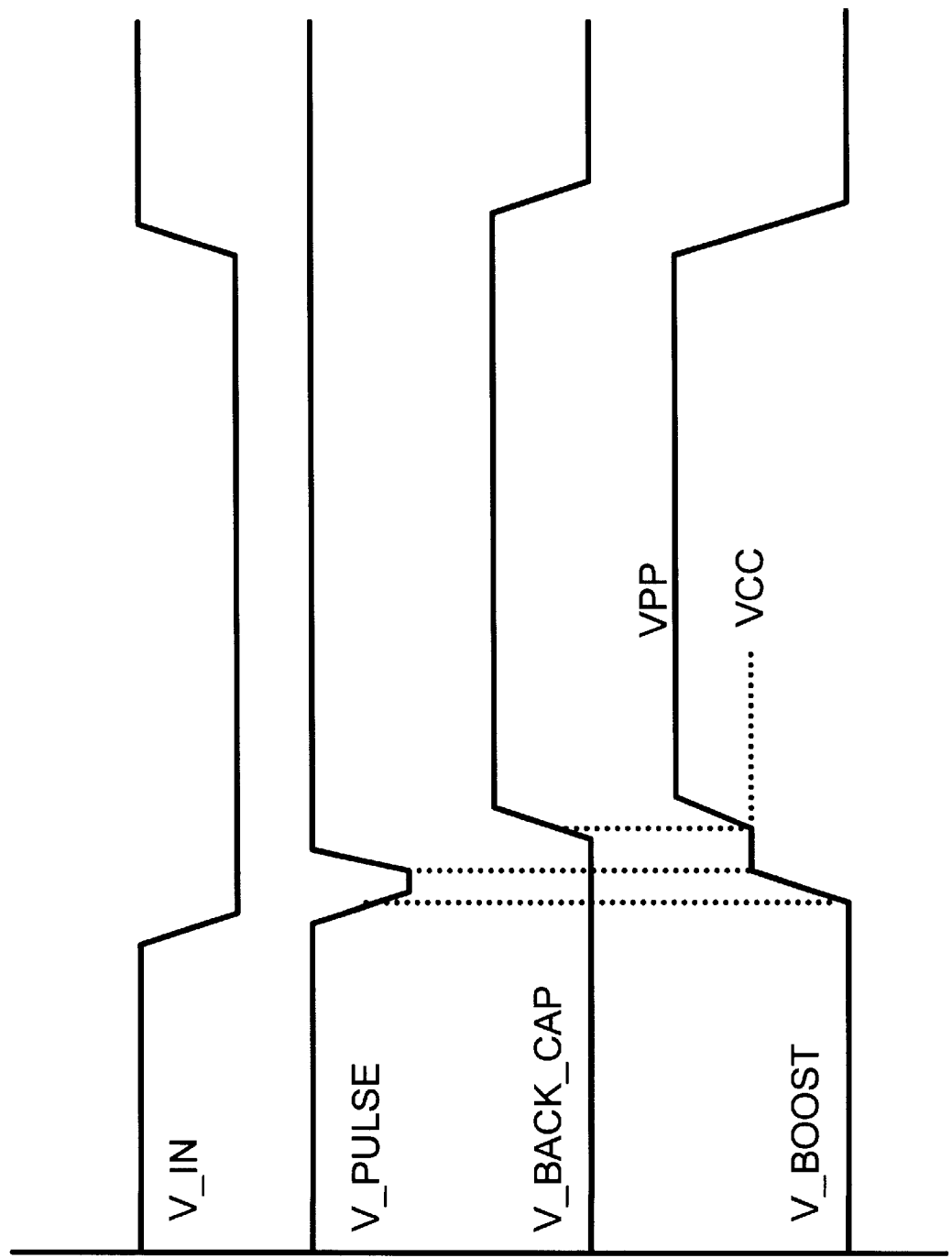
FIG. 6 is a waveform diagram of the operation of the voltage booster circuit.

Waveform—FIG. 6

FIG. 6 is a waveform diagram of the operation of the voltage booster circuit. When the input voltage V_IN is driven low to enable the bus switch, V_PULSE is driven low to enable a pull-up that drives the boosted node's voltage V_BOOST from ground to the power-supply voltage Vcc. The width of the pulse is determined, not by a pulse generator, but by a feedback control loop. The feedback is triggered by a Schmidt-trigger inverter that senses when the voltage of V_BOOST nears Vcc. This feedback control loop is what turns off the pullup driving V_BOOST to Vcc. Thus the pulse is sufficient to drive the boosted node all the way up to Vcc.

Once V_BOOST is sensed to be near Vcc, and after a delay through the charge-pumped delay line, the back-side of the capacitor is driven from ground to Vcc. Only a fraction of the swing of V_BACK_CAP is coupled to the boosted node on the front-side of the capacitor, but this fraction is sufficient to boost voltage V_BOOST from Vcc to Vpp.

When input voltage V_IN is driven high to disable the bus switch, the boosted node is driven low by a pull-down transistor and the pull-ups are disabled. The back-side of the capacitor is also driven to ground to make it ready for a full swing up to Vcc the next time the bus switch is enabled.

ADVANTAGES OF THE INVENTION

The boosted node is actively driven to Vcc by a pull-up transistor, but indirectly boosted above Vcc by capacitive coupling. This is power-efficient since current from a charge pump is limited, while ample current is available from Vcc. The active pullup transistor in not in series with another transistor, so a smaller size can be used for the same current drive.

The pulse to Vcc is self-timed. The delay is not set by a pulse-generator. Instead, the delay or amount of time the boosted node is driven up to Vcc is determined by sensing the voltage of the boosted node. The voltage is sensed by a Schmidt-trigger inverter with a high input threshold, rather than a simple inverter with a lower input threshold. This self-timing can account for process and temperature variations.

The active pullup is turned off by first driving its gate to Vcc using an n-channel pullup, and finally using a p-channel pullup to Vpp. The n-channel pullup can be made large to quickly change the active pullup's gate, V_PULSE, while the p-channel pullup is kept small. The smaller size of the p-channel pullup reduces the size of the inverter driving its gate (inverter 93). Reducing the size of the pullup reduces the current drawn from the Vpp change pump.

The connection of Vpp from the charge pump to the substrates of the p-channel transistors ensures that parasitic diodes remain reverse-biased. Driving inverter 84 in the delay line with the charge-pumped Vpp allows the gate of a p-channel isolation transistor to be driven to Vpp, completely shutting off the transistor and thus isolating the boosted node.

ALTERNATE EMBODIMENTS

Several other embodiments are contemplated by the inventor. For example circuit devices can be substituted for the delay line, perhaps including resistive or capacitive delay elements. Transistor device sizes can be adjusted. Buffers and inversions can be added or removed. N-channel transistors and p-channel transistors can be stacked respectively. The Schmidt-trigger inverter can be implemented in a variety of well-known ways in CMOS technology, and its input threshold can be kept higher for rising inputs than for falling inputs. The exact input threshold can vary, but the rising-input and falling-input thresholds are asymmetric for Schmidt-triggers.

The term "V_PULSE" has been used for the control signal applied to the gate of the p-channel transistor that pulls the boosted node from ground to Vcc. This term was used for a similar control node in the parent application that was driven by a pulse generator. The improved boost circuit has no pulse generator and thus the term "V_PULSE" is not precise. However, using the same term for the same control node in both the original and improved booster circuits is useful for understanding the invention.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

APPENDIX—DEVICE SIZES

The following are the W/L transistor sizes in microns for FIG. 5. L is 0.5 micron unless otherwise indicated. Delay line inverters 90, 92, 93, 84 use 1.0 micron L for both p and n. Gates 62, 64, 74, use W=14 for both p and n. Capacitor 24 is a PMOS transistor with a W/L of 100/2, while inverter 76 uses 0.8/1.2 p and n transistors.

| Reference # | W | L |
| --- | --- | --- |
| 94 | 4 | 2.0 |
| 95 | 20 | 0.5 |
| 96 | 20 | 0.5 |
| 97 | 14 | 0.5 |
| 55 | 42 | 0.5 |
| 56 | 0.8 | 1.0 |
| 58 | 1.6 | 1.0 |
| 48 | 42 | 0.5 |
| 26 | 800 | 0.5 |
|  | W (PMOS) | W (NMOS) |
| 90 | 7 | 4 |
| 92 | 4 | 4 |
| 93 | 8 | 8 |
| 84 | 1 | 1 |
| 66 | 56 | 56 |

I claim:

1. A voltage-boosted bus switch comprising:

an input for indicating when the bus switch is to isolate and when the bus switch is to connect a first node and a second node;

a bus-switch transistor, coupled between the first node and the second node, the bus-switch transistor conducting current between the first node and the second node in response to a boosted node coupled to a gate of the bus-switch transistor;

a first pullup transistor, coupled to drive the boosted node toward a power-supply voltage, the first pullup transistor having a gate connected to a control node;

control pulldown means for discharging the control node in response to the input;

a voltage sensor, coupled to the boosted node, to sense when the boosted node has been charged to near the power-supply voltage by the first pullup transistor;

control isolation means, coupled between the control pulldown means and the control node, for isolating the control node in response to the voltage sensor detecting that the boosted node is near the power-supply voltage;

control pullup means, responsive to the voltage sensor, for charging the control node and disable the first pullup transistor when the voltage sensor detects that the boosted node is near the power-supply voltage; and a capacitor, coupled to the boosted node, for capacitivly coupling a voltage swing into the boosted node when the voltage sensor detects that the boosted node is near the power-supply voltage, whereby the boosted node is boosted above the power-supply voltage.

2. The voltage-boosted bus switch of claim 1 further comprising:

delay-line means, coupled to the voltage sensor, for delaying activation of the control pullup means until after activation of the control isolation means.

3. The voltage-boosted bus switch of claim 2 wherein the control pullup means comprises:

a n-channel transistor for charging the control node to less than the power-supply voltage; and a p-channel transistor for charging the control node to at least the power-supply voltage, whereby the control node is first charged by the n-channel transistor and then by the p-channel transistor.

4. The voltage-boosted bus switch of claim 3 wherein the voltage sensor comprises:

a Schmidt-trigger inverter having a higher input threshold for rising input transitions than for falling input transitions.

5. A voltage booster circuit comprising:

an input;

a boosted node;

a control node, the control node initially driven low by a transition of the input;

a first pull-up, coupled to the boosted node, for pulling the boosted node to a power-supply voltage in response to the control node;

a voltage sensor, coupled to the boosted node, for sensing when the boosted node is pulled up to near the power-supply voltage;

a delay line, coupled to the voltage sensor, for generating a delayed signal in response to the boosted node being pulled up to the power-supply voltage, the delay line also driving the control node high after a delay; and a capacitor, coupled to the boosted node and responsive to the delayed signal, for capacitivly coupling a voltage swing into the boosted node in response to the delayed signal, the voltage swing boosting a voltage of the boosted node to a boosted voltage above the power-supply voltage, whereby the boosted node is first charged to the power-supply voltage by the first pull-up, and then the boosted node activates the delay line to the capacitor to boost the boosted voltage by capacitive coupling.

6. The voltage booster circuit of claim 5 further comprising:

a charge pump for generating a pumped voltage above the power-supply voltage;

wherein the charge pump does not directly supply current to the boosted node to charge the boosted node.

7. The voltage booster circuit of claim 6 further comprising:

a keeper pull-up, coupled to the boosted node and coupled to the charge pump, for supplying a small current to the boosted node, the small current sufficient to offset leakage currents from the boosted node but not sufficient to pull the boosted node up to the pumped voltage.

8. The voltage booster circuit of claim 7 wherein the keeper pull-up is further coupled to the delayed signal from the delay line, the keeper pull-up being enabled by the delayed signal.

9. The voltage booster circuit of claim 6 wherein the voltage sensor is a Schmidt-trigger inverter having a high logic threshold.

10. The voltage booster circuit of claim 9 further comprising:

a second pullup, controlled by the delay line, for driving the control node high after a delay from when the voltage sensor senses that the boosted node is near the power-supply voltage;

a control-node pulldown, responsive to the transition on the input, for initially driving the control node low;

an isolation transistor, coupled between the control-node pulldown and the control node, for isolating the control-node pulldown from the control node once the voltage sensor senses that the boosted node is near the power-supply voltage.

11. The voltage booster circuit of claim 10 wherein the boosted node is coupled to a gate of a bus-switch transistor, the bus-switch transistor driving a greater current when the boosted node is at the boosted voltage than at the power-supply voltage, whereby channel resistance of the bus-switch transistor is decreased by the voltage booster circuit.

12. A voltage booster comprising:

a buffer for buffering an input to generate a buffered input;

a charge pump for generating a pumped voltage above a power-supply voltage;

a boosted node driven from ground to a boosted voltage above the power-supply voltage;

a pull-down n-channel transistor, coupled to drive the boosted node to ground in response to the buffered input;

a pull-up p-channel transistor, having a gate controlled by the buffered input, for coupling the boosted node to a keeper node;

a keeper p-channel transistor, coupled to supply a keeper current to the keeper node from the charge pump, the keeper p-channel transistor having a gate;

a control node, initially driven low in response to the buffered input;

a first p-channel transistor, having a drain coupled to the boosted node and a source coupled to the power-supply voltage, for conducting current from a power supply to the boosted node in response to the control node applied to a gate of the first p-channel transistor;

a second p-channel transistor, having a drain coupled to the control node and a source coupled to the pumped voltage from the charge pump, for conducting current from the pumped voltage to the control node, the second p-channel transistor having a gate controlled by a delayed node; and a delay line of inverters, having a first inverter with an input connected to the boosted node, for delaying a rising transition of the boosted node to drive the delayed node to the second p-channel transistor;

a capacitor, driven by the delay line and coupled to the boosted node, for coupling a voltage swing output from the delay line to the boosted node;

wherein the delay line from the boosted node disables the second p-channel transistor after the boosted node has been charged to the power-supply voltage;

wherein the capacitor is pumped after the delay line delays the rising transition of the boosted node, whereby the voltage booster is self-timed by the boosted node being fed back to the delay line.

13. The voltage booster of claim 12 wherein the first inverter in the delay line comprises a Schmidt-trigger inverter.

14. The voltage booster of claim 13 wherein the Schmidt-trigger inverter has a high input threshold, an output of the Schmidt-trigger inverter being driven low once the boosted node nears the power-supply voltage.

15. The voltage booster of claim 14 wherein only a leakage current is drawn from the charge pump by the voltage booster, the leakage current being a few microamps, whereas a charging current through the first p-channel transistor is a current of several milliamps.

16. The voltage booster of claim 15 wherein the capacitor is a p-channel transistor with a gate connected to the boosted node and a source and a drain connected together to a back-side node.

17. The voltage booster of claim 16 further comprising:

an n-channel pullup transistor, having a gate controlled by the delay line, for driving the control node to a threshold voltage below the power-supply voltage, the n-channel pullup transistor being activated by the delay line before the second p-channel transistor is activated, whereby the control node is first pulled high by the n-channel pullup transistor and then pulled to Vpp by the second p-channel transistor.

18. The voltage booster of claim 17 further comprising:

a first control pull-down transistor, having a gate controlled by the buffered input, for pulling the control node down to ground;

a second control pull-down transistor, coupled in series with the first control pull-down transistor, having a gate controlled by the first inverter in the delay line, for isolating the control node from ground;

wherein the first control pull-down transistor and the second control pull-down transistor are n-channel transistors.

19. The voltage booster of claim 18 wherein the boosted node is coupled to a gate of a bus-switch transistor, the bus-switch transistor having a lower on-resistance when the boosted node is at the boosted voltage than at the power-supply voltage, whereby channel resistance of the bus-switch transistor is decreased by the voltage booster circuit.

20. The voltage booster of claim 19 wherein only a last inverter in the delay line is connected to the pumped voltage from the charge pump and not connected to the power-supply voltage, the last inverter driving a gate of the keeper p-channel transistor, whereby the last inverter in the delay line is outputs the pumped voltage rather than the power-supply voltage.

* * * * *